US010191803B2

(12) United States Patent
En Gad et al.

(10) Patent No.: US 10,191,803 B2
(45) Date of Patent: Jan. 29, 2019

(54) REWRITING FLASH MEMORIES BY MESSAGE PASSING

(71) Applicant: California Institute of Technology, Pasadena, CA (US)

(72) Inventors: Eyal En Gad, Pasadena, CA (US); Wentao Huang, Pasadena, CA (US); Yue Li, Fremont, CA (US); Jehoshua Bruck, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 138 days.

(21) Appl. No.: 15/011,537

(22) Filed: Jan. 30, 2016

(65) Prior Publication Data
US 2016/0224408 A1   Aug. 4, 2016

Related U.S. Application Data

(60) Provisional application No. 62/110,310, filed on Jan. 30, 2015.

(51) Int. Cl.
*G06F 11/07* (2006.01)
*G06F 11/10* (2006.01)
*G06F 11/00* (2006.01)
*H03M 13/00* (2006.01)
*G11C 29/04* (2006.01)

(52) U.S. Cl.
CPC ...... *G06F 11/1008* (2013.01); *G06F 11/1072* (2013.01); *H03M 13/00* (2013.01); *G11C 2029/0411* (2013.01)

(58) Field of Classification Search
None
See application file for complete search history.

(56) References Cited

U.S. PATENT DOCUMENTS

| 9,448,921 B2 * | 9/2016 | Ma ...................... G06F 12/0246 |
| 2012/0079178 A1 | 3/2012 | Litsyn et al. |
| 2012/0210082 A1 | 8/2012 | Sharon et al. |
| 2013/0212451 A1 | 8/2013 | Nemati Anaraki et al. |

(Continued)

FOREIGN PATENT DOCUMENTS

WO   2014/00116301 A1   7/2014

OTHER PUBLICATIONS

Burshtein, D. et al., "Polar Write Once Memory Codes," *IEEE Trans. Inf. Theor.*, vol. 59, No. 8, pp. 5088-5101, Aug. 2013.

(Continued)

*Primary Examiner* — Justin R Knapp
(74) *Attorney, Agent, or Firm* — Kilpatrick Townsend & Stockton LLP

(57) ABSTRACT

Disclosed are constructions of WOM codes that combine rewriting and error correction for mitigating the reliability and the endurance problems typically experienced with flash memory. A rewriting model is considered that is of practical interest to flash memory applications where only the second write uses WOM codes. The disclosed WOM code construction is based on binary erasure quantization with LDGM codes, where the rewriting uses message passing and has potential to share the efficient hardware implementations with LDPC codes in practice. The coding scheme achieves the capacity of the rewriting model.

20 Claims, 10 Drawing Sheets

(56) References Cited

U.S. PATENT DOCUMENTS

| | | | |
|---|---|---|---|
| 2015/0293716 A1* | 10/2015 | Jiang | H03M 13/13 711/154 |
| 2016/0211015 A1* | 7/2016 | Hua | G11C 11/5628 |
| 2016/0335156 A1* | 11/2016 | En Gad | G06F 11/1012 |

OTHER PUBLICATIONS

Chandar, V. et al., "Information embedding codes on graphs with iterative encoding and decoding," in *Proc. ISIT*, Jul. 2006, pp. 866-870.

En Gad et al., "Polar coding for noisy write-once memories," in *Proc. ISIT*, Jun. 2014, pp. 1638-1642.

Gabizon et al. "Invertible zero-error dispersers and defective memory with stuck-at errors," in *APPROX-RANDOM*, 2012, pp. 553-564.

Gelfand, S. et al., "Coding for channel with random parameters," *Problems of Control Theory*, vol. 9, No. 1, pp. 19-31, 1980.

Hagiwara, M. et al., "Quantum quasi-cyclic LDPC codes," in *Proc. ISIT*, Jun. 2007, pp. 806-810.

Hamada, M. "Conjugate codes for secure and reliable information transmission," in *Proc. ITW*, Oct. 2006, pp. 149-153.

Heegard, "On the capacity of permanent memory," *IEEE Trans. Inf. Theor.*, vol. 31, No. 1, pp. 34-42, Jan. 1985.

International Search Report and Written Opinion for International Application No. PCT/US2016/015855, dated May 23, 2016, 10 pages.

Ioffe, L. et al., "Asymmetric quantum error-correcting codes," *Phys. Rev. A.*, vol. 75, p. 032345, Mar 2007.

Jacobvitz et al., "Writing Co-sets of a convolutional code to increase the lifetime of flash memory," in *Proc. Allerton*, Oct. 2012, pp. 308-318.

Jiang et al., "Joint rewriting and error correction in write-once memories," in *Proc. ISIT*, 2013, pp. 1067-1071.

Jiang, et al., "Trajectory codes for flash memory," *IEEE Trans. Inf. Theor.*, vol. 59, No. 7, pp. 4530-4541, Jul. 2013.

Li, Y., et al., "Error correction and partial information rewriting for flash memories," in *Proc. ISIT*, Jun. 2014, pp. 2087-2091.

Ma, Xudong, "On Coding Efficiency for Flash Memories", Proceedings of the 35th IEEE Sarnoff Symposium (SARNOFF), pp. 105, May 21-22, 2012.

MacKay, "Good error-correcting codes based on very sparse matrices," *IEEE Trans. Inf. Theor.*, vol. 45, No. 2, pp. 399-431, Mar. 1999.

Martinian, E. et al., "Iterative quantization using codes on graphs," in *Proc. Allerton*, 2003.

Mondelli, M. et al., "Achieving Marton's region for broadcast channels using polar codes," in *Proc. ISIT*, Jun. 2014, pp. 306-310.

Oswald, P. et al., "Capacity-achieving sequences for the erasure channel," *IEEE Trans. Inf. Theor.*, vol. 48, No. 12, pp. 3017-3028, Dec. 2002.

Rivest, R. et al. "How to reuse a write-once memory," *Information and Control*, vol. 55, No. 1-3, pp. 1-19, 1982.

Sarvepalli, P. K., et al., "Asymmetric quantum codes: constructions, bounds and performance," *Proc. Roy. Soc. of Lond. A Mat.*, vol. 465, No. 2105, pp. 1645-1672, 2009.

Yaakobi, E. et al., "Codes for write-once memories," *IEEE Trans. Inf. Theor.*, vol. 58, No. 9, pp. 5985-5999, Sep. 2012.

Yaakobi, P, et al., "Multiple error-correcting WOM-codes," *IEEE Trans. Inf. Theor.*, vol. 58, No. 4, pp. 2220-2230, Apr. 2012.

Yadgar, G. et al., "Write once, get 50% free: Saving SSD erase costs using WOM codes," in *USENIX FAST*, 2015.

Zemor, et al., "Error-correcting WOM-codes," *IEEE Trans. Inf. Theor.*, vol. 37, No. 3, pp. 730-734, May 1991.

\* cited by examiner

REWRITING FLASH MEMORIES BY MESSAGE PASSING

CROSS-REFERENCE TO RELATED APPLICATIONS

This application is a Non-Provisional application that claims the benefit of priority to U.S. Provisional Patent Application No. 62/110,310 filed on Jan. 30, 2015 entitled "Rewriting Flash Memories by Message Passing", which is herein incorporated by reference in its entirety for all purposes.

STATEMENT AS TO RIGHTS TO INVENTIONS MADE UNDER FEDERALLY SPONSORED RESEARCH AND DEVELOPMENT

This invention was made with government support under Grant No. CIF 1218005 awarded by the National Science Foundation. The government has certain rights in the invention.

BACKGROUND

This disclosure relates to data storage in flash memories and, more particularly, utilizing message passing for rewriting flash memory.

SUMMARY

The techniques described herein can be used to construct write-once memory (WOM) codes that combine rewriting and error correction for mitigating the reliability and the endurance problems generally experienced with flash memory. In the discussion, a rewriting model is considered that is of practical interest to flash memory applications where only the second write uses WOM codes. The disclosed WOM code construction is based on binary erasure quantization (BEQ) with low-density-generator-matrix (LDGM) codes, where the rewriting uses message passing and has the potential to share the efficient hardware implementations with low-density-parity-check (LDPC) codes in practice. The coding scheme achieves the capacity of the rewriting model. Extensive simulations show that the rewriting performance of the scheme compares favorably with that of polar WOM code in the rate region where high rewriting success probability is desired. The coding schemes may be augmented with error correction capability. By drawing a connection to the conjugate code pairs studied in the context of quantum error correction, a general framework for constructing error-correction WOM codes is developed. In this discussion herein, disclosed is an explicit construction of WOM codes whose codewords are contained in so-called BCH codes (from code developers Bose, Chaudhuri, Hocquenghem).

DETAILED DESCRIPTION

I. Introduction

Flash memory has become a leading storage media thanks to its many excellent features such as random access and high storage density. However, it also faces significant reliability and endurance challenges. In flash memory, programming a memory cell (that is, storing a value into a cell) from a lower charge level to a higher charge level can be performed efficiently, while the opposite requires erasing an entire block of cells, which may contain millions of cells. Thus, programming a cell from a higher charge level to a lower charge level involves an erase operation before the write (programming) operation. The erase operation involves a block erasure operation. Such block erasures can degrade cell quality, and current flash memory can effectively survive only a relatively small number of block erasures. The utility of flash memory would be increased if the reliability and the endurance issues could be mitigated. More particularly, discussed herein are write-once memory (WOM) codes that are useful for programming (i.e., information rewriting) and for error correction. This discussion relates to the development of a general framework for constructing error-correction WOM codes. Discussed below are particular constructions of WOM codes whose codewords are contained in BCH codes, which comprise cyclic error-correcting codes.

Figure 1:
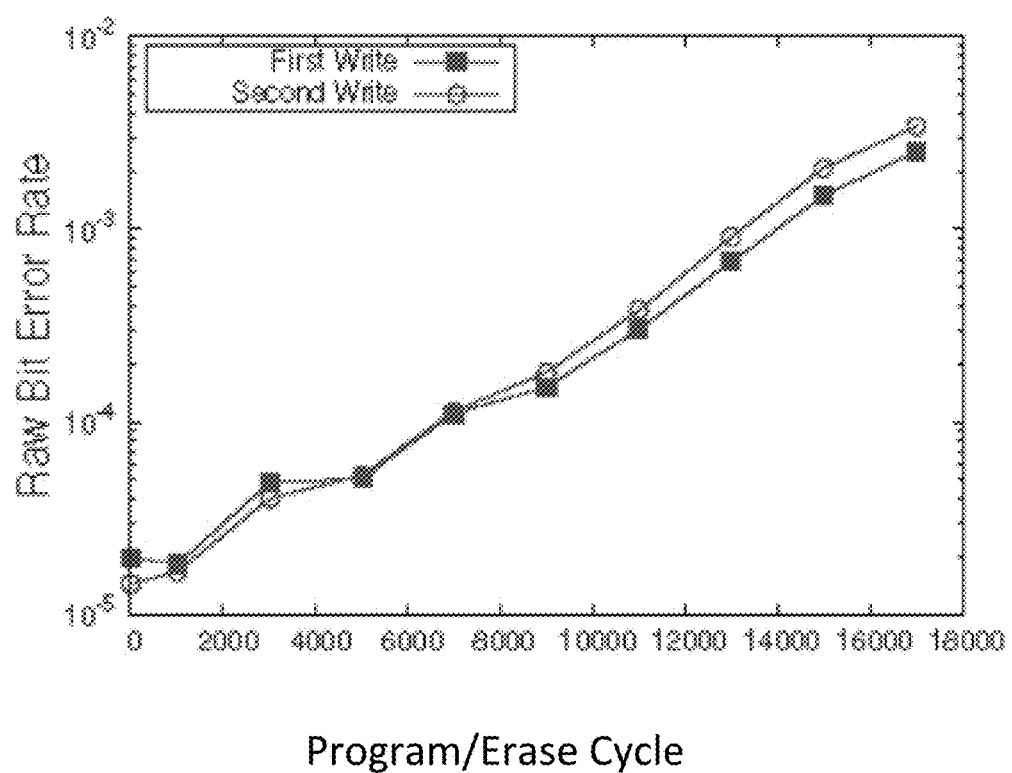
FIG. 1 is an illustration that depicts charge levels of a memory device in an example Rank Modulation system.

WOM was first studied by Rivest and Shamir [see, e.g., R. Rivest and A. Shamir, "How to reuse a write-once memory," *Information and Control*, vol. 55, no. 1-3, pp. 1-19, 1982]. In the model of WOM, new information is written into a cell only by increasing a cell level (that is, by increasing the electrical energy stored in the cell). Compared to traditional flash memory, WOM-coded flash memory achieves higher reliability when the same amount of information is written, or writes more information using the same number of program/erase (P/E) cycles. These benefits are illustrated in FIG. 1, which is a graph 100 that illustrates the bit error rates (BERs) of the first write and the next rewrite measured for the scheme of this discussion in a 16 nm flash memory chip. When using the standard setting for error correcting codes (ECCs), flash memory can survive 14000 P/E cycles without an ECC decoding failure. Using a code as constructed in this document that allows a user to write 35% more information, only 10370 P/E cycles are needed to write the information. Notice that the raw BER at 10370 P/E cycles is much lower than that at 14000 P/E cycles, hence ECC decoding will have much lower failure rate, which leads to higher reliability. On the other hand, if a WOM code is used until ECC fails at 14000 P/E cycles, the total amount information that is written requires 18900 P/E cycles to write in traditional flash. WOM codes can also be used for scrubbing the memory. In this use, the memory is read periodically, to correct errors that were introduced over time. The errors are corrected using an ECC, and the corrected data is written back using a WOM code (see Y. Li, A. Jiang, and J. Bruck, "Error correction and partial information rewriting for flash memories," in *Proc. ISIT*, June 2014, pp. 2087-2091). A variety of WOM constructions were proposed recently. Codes with higher rates have been reported [e.g., A. Jiang, M. Langberg, M. Schwartz, and J. Bruck, "Trajectory codes for flash memory," *IEEE Trans. Inf. Theor.*, vol. 59, no. 7, pp. 4530-4541, July 2013; E. Yaakobi et al., "Codes for write-once memories," *IEEE Trans. Inf. Theor.*, vol. 58, no. 9, pp. 5985-5999, September 2012], and codes that achieve capacity have also been found [D. Burshtein and A. Strugatski, "Polar write once memory codes," *IEEE Trans. Inf. Theor.*, vol. 59, no. 8, pp. 5088-5101, August 2013]. Nevertheless, capacity-achieving WOM codes typically come with a relatively high hardware complexity for implementation.

Alternative Code Construction

In this discussion, an alternative construction of WOM codes is proposed. The scheme herein differs from the WOM codes mentioned above mainly in two aspects. First, the focus is on a specific rewriting model with two writes, where only the second write uses WOM codes. Such a rewriting scheme has no code rate loss in the first write, and recent experimental study has demonstrated its effectiveness on improving the performance of solid state drives [e.g., see G. Yadgar, E. Yaakobi, and A. Schuster, "Write once, get 50% free: Saving SSD erase costs using WOM codes," in *USENIX FAST,* 2015]. Note that, the model of this rewriting scheme is not only an instance of the general WOM model [C. Heegard, "On the capacity of permanent memory," *IEEE Trans. Inf. Theor.*, vol. 31, no. 1, pp. 34-42, January 1985], but also an instance of the model studied by Gelfand and Pinsker [S. Gelfand and M. Pinsker, "Coding for channel with random parameters," *Problems of Control Theory*, vol. 9, no. 1, pp. 19-31, 1980]. Second, the construction herein is based on binary erasure quantization with low-density-generator-matrix (LDGM) codes. The encoding is performed by iterative quantization studied by Martinian and Yedidia [E. Martinian and J. S. Yedidia, "Iterative quantization using codes on graphs," in *Proc. Allerton,* 2003 ("Martinian and Yedidia")], which is a message-passing algorithm similar to the decoding of low-density-parity-check (LDPC) codes. As LDPC codes have been widely adopted by commercial flash memory controllers, the hardware architectures of message-passing algorithms have been well understood and highly optimized in practice. Therefore, the codes discussed herein are implementation-friendly for practitioners. Extensive simulations show that the rewriting performance of our scheme compares favorably with that of the capacity-achieving polar WOM code [see D. Burshtein and A. Strugatski, "Polar Write Once Memory Codes," *IEEE Trans. Inf. Theor.*, vol. 59, no. 8, pp. 5088-5101, August 2013] in the rate region where a low rewriting failure rate is desired. For instance, as discussed herein, the disclosed code allows user to write 40% more information by rewriting with very high success probability. It should be noted that the iterative quantization algorithm of Martinian and Yedidia (see "Iterative quantization using codes on graphs," in *Proc.* *Allerton,* 2003) was used in V. Chandar, E. Martinian, and G. W. Wornell, "Information embedding codes on graphs with iterative encoding and decoding," in *Proc. ISIT,* July 2006, pp. 866-870, in a different way for the problem of information embedding, which shares some similarity with the model disclosed herein.

Moreover, the code construction herein may be extended with error correction. The need for error correction is observed in the disclosed experiments. As shown in FIG. 1, for example, the BERs of both writes increase rapidly with the number of block erasures. Constructions of error-correcting WOM codes have been discussed and studied in recent literature. Error-correcting WOM codes have been proposed, for example, in E. En Gad et al., "Polar coding for noisy write-once memories," in *Proc. ISIT,* June 2014, pp. 1638-1642; A. Gabizon and R. Shaltiel, "Invertible zero-error dispersers and defective memory with stuck-at errors," in *APPROX-RANDOM,* 2012, pp. 553-564; A. Jiang et al., "Joint rewriting and error correction in write-once memories," in *Proc. ISIT,* 2013, pp. 1067-1071; E. Yaakobi, P. Siegel, A. Vardy, and J. Wolf, "Multiple error-correcting WOM-codes," *IEEE Trans. Inf. Theor.*, vol. 58, no. 4, pp. 2220-2230, April 2012; G. Zemor and G. D. Cohen, "Error-correcting WOM-codes," *IEEE Trans. Inf. Theor.*, vol. 37, no. 3, pp. 730-734, May 1991. Different from the existing constructions above, conjugate code pairs are discussed herein, in the context of quantum error correction [see, e.g., M. Hamada, "Conjugate codes for secure and reliable information transmission," in *Proc. ITW,* October 2006, pp. 149-153]. As an example, LDGM WOM codes are constructed herein whose codewords also belong to BCH codes. Therefore, the codes disclosed herein allow one to use any decoding algorithm of BCH codes. The latter have been implemented in most commercial flash memory controllers. Also presented are two additional approaches to add error correction, with a comparison of their performance.

II. Rewriting and Erasure Quantization

A. Rewriting Model

First considered is a rewriting model that allows two writes on a block of n cells in a memory device. A single cell of a memory device has a binary state chosen from the set $\{0,1\}$, with a one-way rewriting constraint, a constraint such as the rewriting constraint that state 1 can be written to state 0, but not vice versa. All cells are initially set to be in state 1, and so there is no writing constraint for the first write. A vector is denoted by a bold text symbol s for n cells, or values, such as $s=(s_1, s_2, \ldots, s_n)$. Thus, the state of the n cells after the first write operation is denoted by the vector s. The second write operation is the focus of the discussion herein, and it is assumed that after the first write, the state of the cells is i.i.d. (independent and identically distributed), where for each i, $\Pr\{s_i=1\}=\beta$. It should be noted that the special case of $\beta=\frac{1}{2}$ is of practical importance, since it approximates the state after a normal page programming in flash memory. In flash memory, the message to be written can be assumed to be random due to data compression and data randomization used in memory controllers. The second write is concerned with how to store a message $m \in \mathbb{F}_2^k$ by changing s to a new state $x$ such that (1) the rewriting constraint is satisfied, and (2) $x$ represents $m$. This is achieved by the encoding operation of a rewriting code $C_R$, using linear BEQ codes, defined formally in the following Definition 1.

Definition 1 (Rewriting Codes).

A rewriting code $C_R$ is a collection of disjoint subsets of $\mathbb{F}_2^n$.

Explanation of Definition 1: Each element of $C_R$ corresponds to a different message. Consider $M \in C_R$ that corresponds to a message $m$, then for all $x \in M$, we say that $x$ is labeled by $m$. The decoding function maps the set of labeled vectors into their labels, which are also the messages. To encode a message $m$ given a state $s$, the encoder needs to find a vector $x$ with label $m$ that can be written over $s$. If the encoder does not find such vector $x$, it declares a failure. The rewriting rate of $C_R$ is defined by $R_{WOM}=k/n$. The rewriting capacity, which characterizes the maximum amount of information that can be stored per cell in the second write, is known to be $\beta$ bits [see, e.g., C. Heegard, "On the capacity of permanent memory," *IEEE Trans. Inf. Theor.*, vol. 31, no. 1, pp. 34-42, January 1985].

Thus, in the rewriting model discussed herein, each cell of a memory device stores one bit, and has a corresponding binary state. The binary state is typically represented as either zero or one. The state of a cell can be changed so that charge can be added to the cell, but the reverse change in cell state is not allowed. For example, a change from a state of zero to a state of one is possible, but not from one to zero. The first write operation leaves the cell in a particular state, such that a cell value to be written is received in a message passed to a controller of the memory device. The controller must then read the current state of the cell and determine a codeword of a rewriting code for storing to the cell in a second write operation such that the value to be written from the message may be recovered in a subsequent read operation of the cell. In this discussion, a "message" refers to a string of bit values comprising a vector m that is to be stored into a sequence of n cells. The rewriting model discussed herein involves storing the received message m into a set of n cells (i.e., a block of cells) denoted by s, comprising the set of n cells, after a first write operation. For the write operation, the state of the cells s is changed to a new state x such that the rewriting constraint (charge can be added to the cell, but the reverse change in cell state is not allowed) is satisfied and such that x represents the received message m.

Rewriting codes with rates close to the capacity are discussed herein, together with efficient encoding algorithms with low failure probability. The main observation in the design of the proposed rewriting scheme of this discussion is that the rewriting problem is related to the problem of binary erasure quantization (BEQ), introduced in the next subsection.

B. Binary Erasure Quantization

The BEQ problem for rewriting codes is concerned with the quantization of a binary source sequence s', for which some bits are erased. Formally, $s' \in \{0,1,*\}^n$, where * represents erasures. In this case, the source sequence s' needs to be quantized (compressed) such that every non-erased symbol of s' will maintain its value in the reconstructed vector. A reconstructed vector with such property is said to have no distortion from s'. In this discussion, linear BEQ codes are used, defined as follows:

Definition 2 (Linear BEQ Codes).

A linear BEQ code $C_Q$ is a subspace of $\mathbb{F}_2^n$. Each $c \in C_Q$ is called a codeword of $C_Q$. The dimension of $C_Q$ is denoted by r.

The Definition 2 given above may be better understood by noting that each codeword of $C_Q$ is labeled by a different r-bits sequence $u$. Given a BEQ code $C_Q$ and a source sequence s', a quantization algorithm Q is invoked to find a label $u$ whose codeword $c \in C_Q$ has no distortion from s'. If such label is found, it is denoted by $u = Q(s')$, and is considered as the compressed vector. Otherwise, a quantization failure is declared, and $Q(s')=$Failure. The reconstruction uses a generator matrix $G_Q$ of $C_Q$ to obtain the codeword $c = u\, G_Q$.

C. Reduction from Rewriting to Erasure Quantization

In this subsection the problem of rewriting will be shown to be efficiently reduced to that of the BEQ problem noted above. To begin, let $C_Q$ be a linear quantization code, and let H be a parity-check matrix of $C_Q$. The construction of a suitable rewriting code is given by Construction 3, below.

Construction 3 (Rewriting Code).

A rewriting code $C_R$ is constructed as the collection of all cosets of $C_Q$ in $\mathbb{F}_2^n$. A decoding function for $C_R$ is defined by a parity check matrix H of $C_Q$, such that a vector $x \in \mathbb{F}_2^n$ is decoded into its syndrome $$DEC_H(x) = x H^T.$$

Since the dimension of $C_Q$ is r, it has $2^{n-r}$ cosets. Therefore the rate of $C_R$ is $$R_{WOM} = \frac{n-r}{n},$$

implying that $k = n - r$. It is necessary to define some notation before introducing the reduction algorithm. Let $(H^{-1})^T$ be a left inverse for $H^T$, meaning that $(H^{-1})^T H^T$ is the $k \times k$ identity matrix. Define a function BEC: $\{0,1\}^n \times \{0,1\}^n \to \{0,1,*\}^n$ as:

$$BEC(w, v)_i = \begin{cases} w_i & \text{if } v_i = 0 \\ * & \text{if } v_1 = 1 \end{cases}, \forall i = 1, \ldots, n$$

BEC($w$, $v$) realizes a binary erasure channel that erases entries in $w$ whose corresponding entries in $v$ equal 1. Next, in Theorem 4, the encoding algorithm for the rewriting problem is introduced.

Theorem 4 (Encoding Algorithm for Rewriting).

Algorithm 1 below either declares a failure or returns a vector $x$ such that $x$ is rewritable over s and $x H^T = m$.

The proof of Theorem 4 is given next, for completeness, but understanding the proof is not necessary for general understanding of the techniques disclosed herein.

Proof:

Suppose failure is not declared and $x$ is returned by Algorithm 1. It is first proved that $x$ is rewritable over s. Consider i such that $s_i = 0$. Then it follows from the definition of BEC that $s'_i = z_i$. Remember that $Q(s')$ returns a label $u$ such that $c = \circledR\, u\, G_Q$ has no-distortion from s'. Therefore, $c_i = s'_i = z_i$, and $x_i = c_i + z_i = z_i + z_i = 0 = s_i$. So $x$ can be written over s. To prove the second statement of the theorem, notice that $$xH^T = (uG_Q + z)H^T = uG_Q H^T + m(H^{-1})^T H^T$$
$$= m(H^{-1})^T H^T = m.$$

---

Algorithm 1 x = ENC($G_Q$, m, s): Encoding Algorithm for Rewriting

1:      $z \leftarrow m(H^{-1})^T$
2:      $s' \leftarrow BEC(z, s)$

-continued

Algorithm 1 x = ENC($G_Q$, m, s): Encoding Algorithm for Rewriting

```
3:    u ← Q(s')
4:    if u = FAILURE then
5:        return FAILURE
6:    else
7:        return x ← u$G_Q$ + z
8:    end if
```

The proof of Theorem 4 shows that Algorithm 1 generates the desired vector $x$ or Algorithm 1 declares a failure of the method. In the case of a failure, a likely response may be to find a "blank" sequence of cells (i.e., a string of cells that have not been written to) such that the received message m can effectively be used as the first write operation for the blank sequence of cells, such that m can be written directly into the sequence of cells. Other failure response scenarios are discussed below.

III. Rewriting with Message Passing

This section discusses how to choose a quantization code $C_Q$ and quantization algorithm Q to obtain a rewriting scheme of good performance. The approach is to use an application of the iterative quantization scheme described in Martinian and Yedidia [see citation above], where $C_Q$ is an LDGM code, and Q is a message-passing algorithm. This approach is particularly relevant for flash memories, since the hardware architecture of message-passing algorithms is well understood and highly optimized in flash controllers.

The algorithm Q can be implemented by a sequential or parallel scheduling, as described in Martinian and Yedidia, at Section 3.4.2. For concreteness, consider the sequential algorithm denoted by ERASURE-QUANTIZE in Martinian and Yedidia. Since the performance of ERASURE-QUANTIZE depends on the chosen generator matrix, denote it by the notation Q($G_Q$, s'). The technique, which will be referred to as the Iterative Quantization Algorithm Q($G_Q$, s'), is presented below as Algorithm 2, for completeness, but is not necessary to understand Algorithm 2 for generally understanding the exemplary Algorithm Q or the other techniques disclosed herein.

Iterative Quantization Algorithm

Denote $G_Q = (g_1, \ldots, g_n)$ such that $g_j$ is the j-th column of $G_Q$. The Iterative Quantization Algorithm for Q($G_Q$, s') is given below as Algorithm 2:

Algorithm 2 (Iterative Quantization Algorithm) u = Q($G_Q$, s').

```
1:    v ← s'
2:    while ∃j such that $v_j$ ≠ * do
3:        if ∃i such that ∃! j for which $G_Q$ (i, j) = 1 and $v_j$ ≠* then
4:            Push (i, j) into the Stack.
5:            $v_j$ ← *.
6:        else
7:            return FAILURE
8:        end if
9:    end while
10:   u ← $0_{n-k}$
11:   while Stack is not empty do
12:       Pop (i, j) from the Stack.
13:       $u_i$ ← u · $g_j$ + $s'_j$
14:   end while
15:   return u
```

Next, how to choose a generator matrix $G_Q$ that works well together with Algorithm Q will be described. Below, it is shown that a matrix $G_Q$ with good rewriting performance can be chosen to be a parity-check matrix that performs well in message-passing decoding of erasure channels. This connection follows from the connection between rewriting and quantization, together with a connection between quantization and erasure decoding, as shown in Martinian and Yedidia, referenced above. These connections imply that the rich theory and understanding of the design of parity-check matrices in iterative erasure decoding can be used to construct good generating matrices for rewriting schemes. To make the statement precise, consideration will be given to the standard iterative erasure-decoding algorithm denoted by ERASURE-DECODE(H, y), such as shown in Martinian and Yedidia, where H is an LDPC matrix and y is the output of a binary erasure channel.

Theorem 5.

For all $m \in \mathbb{F}_2^k$ and $z$', s$\in \mathbb{F}_2^n$, ENC($G_Q$, $m$, s) fails if and only if ERASURE-DECODE($G_Q$, BEC($z$', s+$1_n$)) fails, where $1_n$ is the all-one vector of length n.

The proof of Theorem 5 is given next, for completeness, but understanding the proof of Theorem 5 is not necessary for general understanding of the techniques disclosed herein.

Proof of Theorem 5. Proof: As in Algorithm 1, let $z = m$ (H$^{-1}$)$^T$ and s'=BEC($z$, s). Now according to Algorithm 1, ENC($G_Q$, $m$, s) fails if and only if Q($G_Q$, s') fails. According to Martinian and Yedidia, above, and Theorem 4, Q($G_Q$, s') fails if and only if ERASURE-DECODE ($G_Q$, BEC($z'$, s+$1_n$)) fails. This completes the proof. The running time of the encoding algorithm ENC is analyzed formally in the following theorem, Theorem 6.

Theorem 6.

The algorithm ENC($G_Q$, $m$, s) runs in time $\mathcal{O}$ (nd) where n is the length of s and d is the maximum degree of the Tanner graph of $G_Q$.

The proof of Theorem 6 is given next, for completeness, but understanding the proof is not necessary for general understanding of the techniques disclosed herein.

Proof of Theorem 6. Proof: First, show that Step 1 of Algorithm 1 runs in time $\mathcal{O}$ (n) if (H$^{-1}$)$^T$ is chosen in the following way. For any $C_Q$, its parity check matrix H can be made into systematic form, i.e., H=(P I), by row operations and permutation of columns. Then (H$^{-1}$)$^T$ can be chosen as $(0_{k \times n-k} I_k)$, and so $z = m$ (H$^{-1}$)$^T=(0_{n-k}\ m$ ). By Martinian and Yedidia (referenced above) and by Theorem 5, it follows that Step 3 of Algorithm 1 runs in time $\mathcal{O}$ (nd). By the definition of d, the complexity of Step 7 of Algorithm 1 is also $\mathcal{O}$ (nd). Therefore $\mathcal{O}$ (nd) dominates the computational cost of the algorithm. Moreover, Theorems 5 and Theorem 6, together with the analysis and design of irregular LDPC codes that achieve the capacity of the binary erasure channel [see P. Oswald and A. Shokrollahi, "Capacity-achieving sequences for the erasure channel," IEEE Trans. Inf. Theor., vol. 48, no. 12, pp. 3017-3028, December 2002], imply the following capacity-achieving results.

Corollary 7.

There exists a sequence of rewriting codes that can be efficiently encoded by Algorithm 1 and efficiently decoded by Equation (1) that achieves the capacity of the rewriting model β.

The proof of Corollary 7 is given next, for completeness, but understanding the proof is not necessary for general understanding of the techniques disclosed herein.

Proof of Corollary 7. Proof: Let $\bar{s}$=s+$1_n$. Then it follows from Theorem 5 that for all $G_Q$, $m \in \mathbb{F}_2^k$, $z' \in \mathbb{F}_2^n$, and Pr{ENC($G_Q$, $m$, s)=Failure}=Pr{ERASURE-DECODE ($G_Q$, BEC($z$ ', $\bar{s}$))=Failure}), where s is distributed i.i.d. with Pr{$s_i$}=β. The right-hand side is the decoding-failure probability of an LDPC code with parity-check matrix $G_Q$ over a binary erasure channel, using message-passing decoding.

The erasure probability of the channel is $1-\beta$, because $\Pr\{\bar{s}_i=1\}=1-\Pr\{s_i=1\}$. The capacity of a binary erasure channel with erasure probability $1-\beta$ is $\beta$. This is also the capacity of the rewriting model. In addition, the rate of an LDPC code with parity-check matrix $G_Q$ is equal to the rate of a rewriting code constructed by the cosets of $C_Q$. It is shown in P. Oswald and A. Shokrollahi, "Capacity-achieving sequences for the erasure channel," referenced above, how to construct a sequence of irregular LDPC codes that achieves the capacity of the binary erasure channel. Such sequence, used for rewriting codes, achieves the rewriting capacity.

Figure 2:
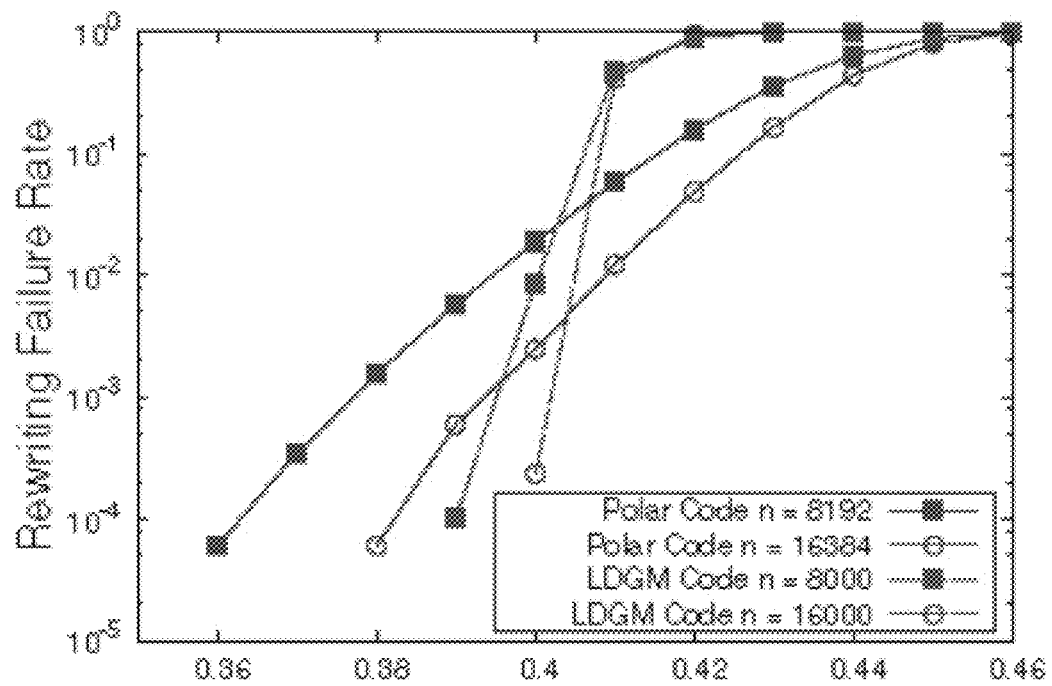
FIG. 2 is an illustration that depicts threshold voltage distributions of a Multi-Level Cell (MLC) memory device.
Figure 2:
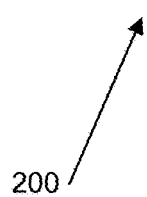

The finite-length performance of the rewriting scheme disclosed herein is evaluated using extensive simulation with the choice of $\beta=0.5$ and $G_Q$ to be the parity-check matrix of a Mackay code [see D. MacKay, "Good error-correcting codes based on very sparse matrices," *IEEE Trans. Inf. Theor.*, vol. 45, no. 2, pp. 399-431, March 1999]. The rewriting failure rates of the disclosed codes with lengths n=8000 and n=16000 that are relevant to flash applications may be compared with those of the polar WOM codes of lengths $2^{13}$ and $2^{14}$ (see, e.g., D. Burshtein and A. Strugatski, "Polar write once memory codes," *IEEE Trans. Inf. Theor.*, vol. 59, no. 8, pp. 5088-5101, August 2013). FIG. 2 shows a graph 200 that depicts the rewriting failure rates of both codes at different rewriting rates, where each point is calculated from $10^5$ experiments. It should be remembered that the capacity of the model is 0.5. The results suggest that the disclosed scheme achieves a decent rewriting rate (e.g. 0.39) with low failure rate (e.g., $<10^{-4}$). Moreover, the disclosed codes provide significantly lower failure rates than polar WOM codes when the rewriting rate is smaller, because of the good performance in the waterfall region of the message-passing algorithm.

Handling Encoding Failures

The encoding failure event could be dealt with in several ways. A simple solution is to try writing on different invalid pages, if available, or to simply write into a fresh page, as current flash systems do. If the failure rate is small enough, say below $10^{-3}$, the time penalty of rewriting failures would be small. For an alternative solution, a reformulation of Martinian and Yedidia and Theorem 3 may be stated for handling an encoding failure. The proposal for handling an encoding failure event may be stated as Proposition 10, given below.

Proposition 10.

For all $m$, $m' \in \mathbb{F}_2^k$ and $s \in \mathbb{F}_2^n$, ENC($G_Q$, $m$, s) fails if and only if ENC($G_Q$, $m'$, s) fails.

The proof of Proposition 10 is given next, for completeness, but understanding the proof is not necessary for general understanding of the techniques disclosed herein.

Proof of Proposition 10:

As in Algorithm 1, let $z = m(H^{-1})^T$ and s'=BEC($z$, s). Note that ENC($G_Q$, $m$, s) fails if and only if Q($G_Q$, s') fails. By Algorithm 2, the failure of Q($G_Q$, s') is determined only according to the locations of erasures in s', and does not depend on the values of the non-erased entries of s'. Since s'=BEC($z$, s), the locations of erasures in s' are only determined by the state s. This completes the proof.

Proposition 10 implies that whether a page is rewritable does not depend on the message to be written. This property suggests that the flash controller can check whether a page is rewritable right after it is being invalidated, without waiting for a message to arrive. An invalid page could be marked as 'unrewritable', such that data would be rewritten only into rewritable pages. This policy would guarantee that the rewriting of a new message always succeed. However, this policy also implies that the message passing algorithm would run more than once for the rewriting of a page.

IV. Error-Correcting Rewriting Codes

The construction of error-correcting rewriting codes is based on a pair of linear codes $(C_1, C_Q)$, that satisfies the condition $C_1 \supseteq C_Q$, meaning that each codeword of $C_Q$ is also a codeword of $C_1$. Define $C_2$ to be the dual of $C_Q$, denoted by $C_2 = C_Q^\perp$. A pair of linear codes $(C_1, C_2)$, that satisfies $C_1 \supseteq C_2^\perp$ is called a conjugate code pair, and it is useful in quantum error correction and cryptography [see M. Hamada, "Conjugate codes for secure and reliable information transmission," in *Proc. ITW*, October 2006, pp. 149-153]. For the flash memory application, let $C_1$ be an error-correction code, while $C_2^\perp = C_Q$ is a BEQ code. An important idea in the construction of error-correcting rewriting codes is to label only the codewords of $C_1$, according to their membership in the cosets of $C_Q$. The construction is defined formally as follows, in Construction 8.

Construction 8.

For $c \in C_1$, let $c + C_Q$ be the coset of $C_Q$ in $C_1$ that contains $c$. Then the error-correcting rewriting code is constructed to be the collection of cosets of $C_Q$ in $C_1$.

Next the matrices $(H^{-1})^T$ and $H^T$ to be used in encoding and decoding will be defined. Let $G_1$ and $G_Q$ be generator matrices of the codes $C_1$ and $C_Q$, respectively, such that each row of $G_Q$ is also a row of $G_1$. Since $C_1$ contains $C_Q$, such matrix pair always exists. Define $(H^{-1})^T$ to be constructed by the rows of $G_1$ that are not rows of $G_Q$. Let $H^T$ be a right inverse of $(H^{-1})^T$.

The encoding is performed according to Algorithm 1, with the matrix $(H^{-1})^T$ as defined above. Note that in Step 1, $z$ is a codeword of $C_1$, since each row of $(H^{-1})^T$ is also a row of $G_1$. In addition, in Step 7, $u G_Q$ is also a codeword of $C_1$ (unless Q($G_Q$, s') fails), since $C_Q$ is contained in $C_1$. Therefore, $x = u G_Q + z$ a codeword of $C_1$. The decoding can begin by the recovery of $x$ from its noisy version, using the decoder of $C_1$. The message $m$ can then be recovered by the product $x H^T$.

A similar framework was described in the publication to A. Jacobvitz, R. Calderbank, and D. Sorin, "Writing cosets of a convolutional code to increase the lifetime of flash memory," in *Proc. Allerton*, October 2012, pp. 308-318, which proposed a construction of a repetition code contained in a Hamming code, with a Viterbi encoding algorithm. This disclosure makes the connection to the quantum coding literature, which allows construction of stronger codes.

Conjugate Codes Construction

According to the construction, a conjugate pair $(C_1, C_2)$ is desired such that $C_1$ is a good error-correcting code, while $C_2^\perp$ is a good LDGM quantization code. Theorem 5 implies that $C_2$ needs to be an LDPC code with a good performance over a binary erasure channel (under message passing decoding). Constructions of conjugate code pairs in which $C_2$ is an LDPC code are studied in M. Hagiwara and H. Imai, "Quantum quasi-cyclic LDPC codes," in *Proc. ISIT*, June 2007, pp. 806-810; L. Ioffe and M. Mézard, "Asymmetric quantum error-correcting codes," *Phys. Rev. A*, vol. 75, p. 032345, March 2007; and P. K. Sarvepalli, A. Klappenecker, and M. Rötteler, "Asymmetric quantum codes: constructions, bounds and performance," *Proc. Roy. Soc. of Lond. A Mat.*, vol. 465, no. 2105, pp. 1645-1672, 2009. In Sarvepalli et al. [P. K. Sarvepalli, A. Klappenecker, and M. Rötteler, "Asymmetric quantum codes: constructions, bounds and performance," *Proc. Roy. Soc. of Lond. A Mat.*, vol. 465, no. 2105, pp. 1645-1672, 2009] a pair of codes is constructed such that $C_1$ is a BCH code and $C_2$ is a Euclidean geometry LDPC code, which is particularly useful for the code purposes herein. This is because BCH codes are used extensively for error correction in flash memories. Below the construction of Euclidean geometry LDPC codes are briefly reviewed, and then the application of the results in the discussion of P. K. Sarvepalli, A. Klappenecker, and M. Rötteler, "Asymmetric quantum codes: constructions, bounds and performance," *Proc. Roy. Soc. of Lond. A Mat.*, vol. 465, no. 2105, pp. 1645-1672, 2009, to the disclosed settings are discussed.

Denote by $EG(m, p^s)$ the Euclidean finite geometry over $\mathbb{F}_{p^s}$ consisting of $p^{ms}$ points. Note that this geometry is equivalent to the vector space $\mathbb{F}_{p^s}^m$. A μ-dimensional subspace of $\mathbb{F}_{p^s}^m$ or its coset is called a μ-flat. Let J be the number of γ-flats that do not contain the origin, and let $\alpha_1, \ldots \alpha_{p^{sm}-1}$ be the points of $EG(m, p^s)$ excluding the origin. Construct a J×$p^{sm}$−1 matrix $H_{EG}$ in the way that its (i, j)-th entry equals 1 if the i-th μ-flat contains $\alpha_j$, and equals 0 otherwise. $H_{EG}$ is the parity check matrix of the (Type-I) Euclidean geometry LDPC code $C_{EG}(m, \mu, s, p)$. $C_{EG}(m, \mu, s, p)$ is a cyclic code and by analyzing the roots of its generator polynomial, the following result of Proposition 9 is obtained [see also P. K. Sarvepalli, A. Klappenecker, and M. Rötteler, "Asymmetric quantum codes: constructions, bounds and performance," *Proc. Roy. Soc. of Lond. A Mat.*, vol. 465, no. 2105, pp. 1645-1672, 2009].

Proposition 9.

$C_{EG}^{\perp}(m, \mu, s, p)$ is contained in a BCH code of design distance $\delta = p^{\mu s} - 1$.

Figure 3:
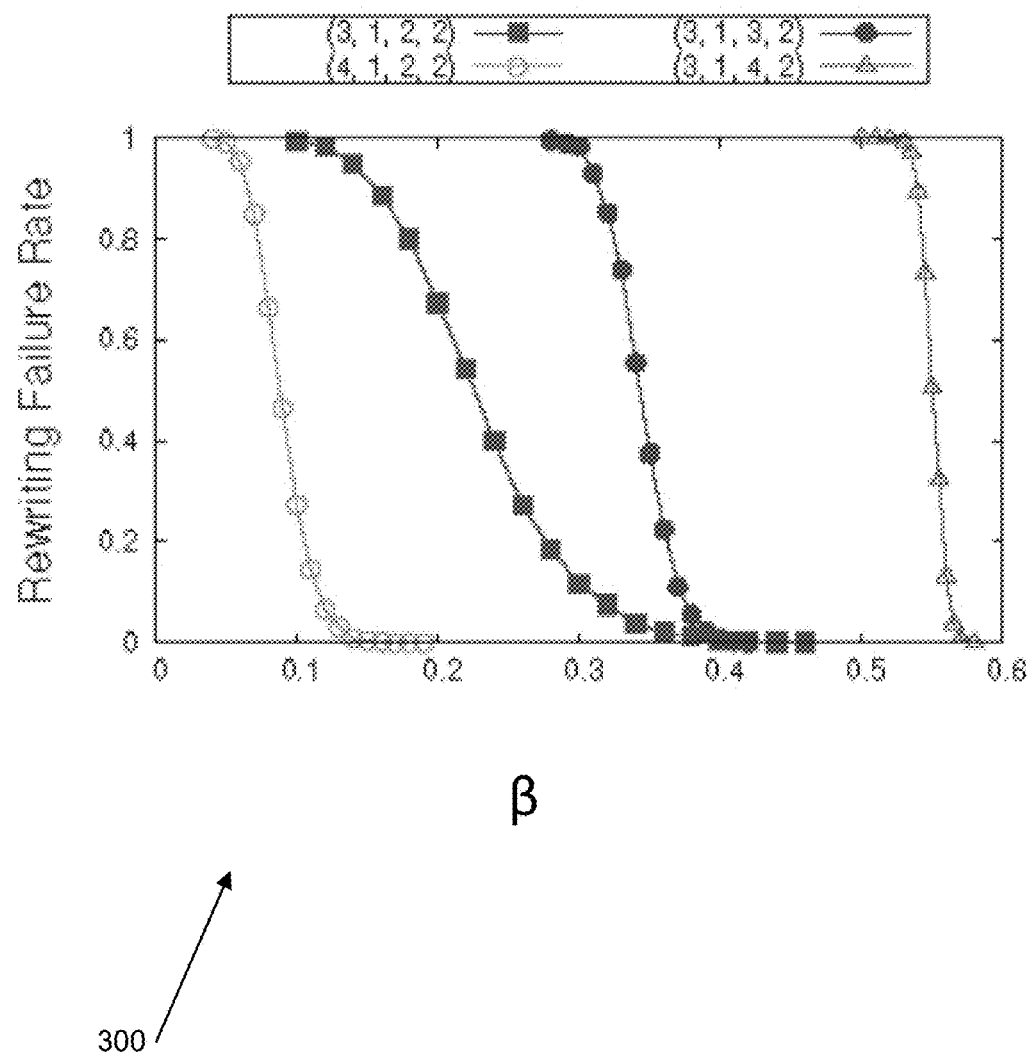
FIG. 3 is an illustration that depicts memory device RBER's, the ratio between the number of bit errors and total number of bits in a memory block of the memory device.

Hence it is possible to choose $C_2$ to be $C_{EG}(m, \mu, s, p)$ and $C_1$ to be a BCH code with distance equal to or smaller than δ. Some possible code constructions are shown in Table I below. Their encoding performance, with respect to the probability β that a cell in the state is writable, is shown in FIG. 3. That is, FIG. 3 is a graph 300 that depicts memory device RBER's, which comprise the ratio between the number of bit errors and total number of bits in a memory block of the memory device. Note from FIG. 3 that a code with smaller rewriting rate achieves a fixed failure rate at a smaller value of β. In particular, the codes corresponding to the top three rows of Table I below achieve very small failure rate at β=0.5, the point of practical interest. These results also show that the slope of the figures becomes sharper when the length of the codes increases, as expected. Out of the three codes that can be rewritten with β=0.5, $C_{EG}(3,1,3,2)$ poses the best rate and error-correction capability.

TABLE I

Error-correcting Rewriting Codes Constructed from pairs of conjugate BCH and EG-LDPC Codes.

| (m, μ, s, p) | $C_1$ [n, k, δ] | $C_2$ [n, k] | Rewriting Rate |
|---|---|---|---|
| (4, 1, 2, 2) | [255, 247, 3] | [255, 21] | 0.0510 |
| (3, 1, 2, 2) | [65, 57, 3] | [65, 13] | 0.1111 |
| (3, 1, 3, 2) | [511, 484, 7] | [511, 139] | 0.2192 |
| (3, 1, 4, 2) | [4095, 4011, 15] | [4095, 1377] | 0.3158 |

V. Alternative Approaches for Error Correction

In this section are presented two alternative approaches to combine rewriting codes with error correction.

A. Concatenated Codes

In this scheme, the disclosed technique is to concatenate an LDGM rewriting code with a systematic error-correcting code. The outer code is an LDGM rewriting code without error-correction capability, as described in Section III. The systematic ECC is used as the inner code. The concatenated scheme is used in the second write. The scheme requires the first write to reserve some bits to store the redundancy of the ECC in the second write.

In the second write, the encoder begins by finding a vector $\boldsymbol{x}$ that can be written over the current state. After $\boldsymbol{x}$ is written, the systematic ECC calculates the redundancy bits required to protect $\boldsymbol{x}$ from errors. The redundancy bits are then written into the reserved cells. The decoding of the second write begins by recovering $\boldsymbol{x}$ using the systematic ECC and its redundancy bits. After $\boldsymbol{x}$ is recovered, the decoder of the rewriting code recovers the stored message from $\boldsymbol{x}$.

It should be noted that reserving bits for the second write can have a negative effect on the performance of the system, since it reduces the total amount of information that could be stored in the memory on a given time. Therefore, the next subsection extends the concatenation scheme using a chaining technique, with the aim of reducing the number of bits required to be reserved for the second write.

B. Code Chaining

The code chaining approach is inspired by a similar construction that has been used in polar coding for other purposes [see M. Mondelli, S. Hassani, R. Urbanke, and I. Sason, "Achieving Marton's region for broadcast channels using polar codes," in *Proc. ISIT*, June 2014, pp. 306-310]. The idea is to chain several code blocks of short length. In the following we use a specific example to demonstrate the idea. It is useful to use a BCH code for error correction, since its performance can be easily calculated. It should be noted, however, that LDPC codes may be used in practice, such that the circuit modules may be shared with the rewriting code, to reduce the required area. The performance of LDPC code in the considered parameters is similar to that of BCH codes.

A typical BCH code used in flash memory has the parameters [8191, 7671, 81], where the length of the BCH code is 8191, the dimension is 7671, and the minimum distance is 81. If this code is used in a concatenated scheme for the second write, the first write needs to reserve 8191−7671=529 bits for redundancy.

To reduce the amount of required reserved bits, consider the chaining of eight systematic BCH codes with the parameters [1023, 863, 33]. The encoding is performed sequentially, beginning with the rewriting encoding that finds a vector $\boldsymbol{x}_1$ of 863 bits. The vector $\boldsymbol{x}_1$ represents a message $\boldsymbol{m}_1$ of 310 bits, according to an [863, 310]-LDGM rewriting code. Once $\boldsymbol{x}_1$ is found, the BCH encoder finds 1023−863=160 redundancy bits to protect $\boldsymbol{x}_1$, as in the concatenated scheme. The encoder then "chains" the redundancy bits forward, by encoding them, together with 150 new information bits, into another block of 863 bits, using the [863, 310]-LDGM code. Let $\boldsymbol{m}_2$ denote the vector of 310 bits encoded into the second block. $\boldsymbol{m}_2$ contains the 160 redundancy bits of $\boldsymbol{x}_1$, together with the additional 150 information bits. Note that once $\boldsymbol{m}_2$ is decoded, the redundancy bit of $\boldsymbol{x}_i$ are available, allowing the recovery $\boldsymbol{x}_1$, and then $\boldsymbol{m}_1$. The encoding continues in this fashion for eight times, to write over a total of eight blocks, each containing 863 cells. The 160 redundant bits used to protect $\boldsymbol{x}_8$ are stored in the reserved cells. The decoding is performed in the reverse order, where each decoded vector contains the redundancy bits of the previous block.

C. Comparison

Next are compared the different error-correction approaches, with a following discussion of their trade-offs. The first code in the comparison is a conjugate code pair, as described in Section IV. The code used is a conjugation of a [511, 484, 7]-BCH code containing a [511, 372]-LDGM code, dual to the (3,1,3,2)-Euclidean geometry LDPC code in Table I. The second code in the comparison is a concatenation of an outer [7671, 2915]-LDGM Mackay rewriting code with an inner [8191, 7671, 81]-BCH code. The third code is a chaining of eight blocks of [863, 310]-LDGM Mackay codes, each concatenated with a [1023, 863, 33]-BCH code. The decoding BER $P_D$, being the fraction a of bits required to be reserved, and the rewriting rate $R_{WOM}$ of the codes are compared. The encoding failure rate of each of the three codes for $\beta=0.5$ is below $10^{-3}$. $P_D$ is estimated with a standard flash memory assumption of a raw BER of $1.3 \times 10^{-3}$. To achieve a comparable code length, the conjugated code is assumed to be used sixteen times in parallel, with a total length of 511×16=8176. The comparison is summarized in Table II, below.

TABLE II

Error-correcting rewriting codes of length ≈8200.

| Code | $P_D$ | $\alpha$ | $R_{WOM}$ |
|---|---|---|---|
| Conjugated | $10^{-5}$ | 0% | 0.21 |
| Concatenated | $10^{-16}$ | 6.3% | 0.35 |
| Chained | $10^{-16}$ | 2% | 0.19 |

Flash data storage systems generally require $P_D$ below $10^{-15}$. It can be seen in Table II that a conjugated code still does not satisfy the reliability requirement. It can also be seen that concatenated codes that satisfy the reliability requirement need a large fraction of reserved space. The chained code reduces the fraction of reserved space to 2%, with a rate penalty in the second write.

VI. Device Implementations

Figure 4:
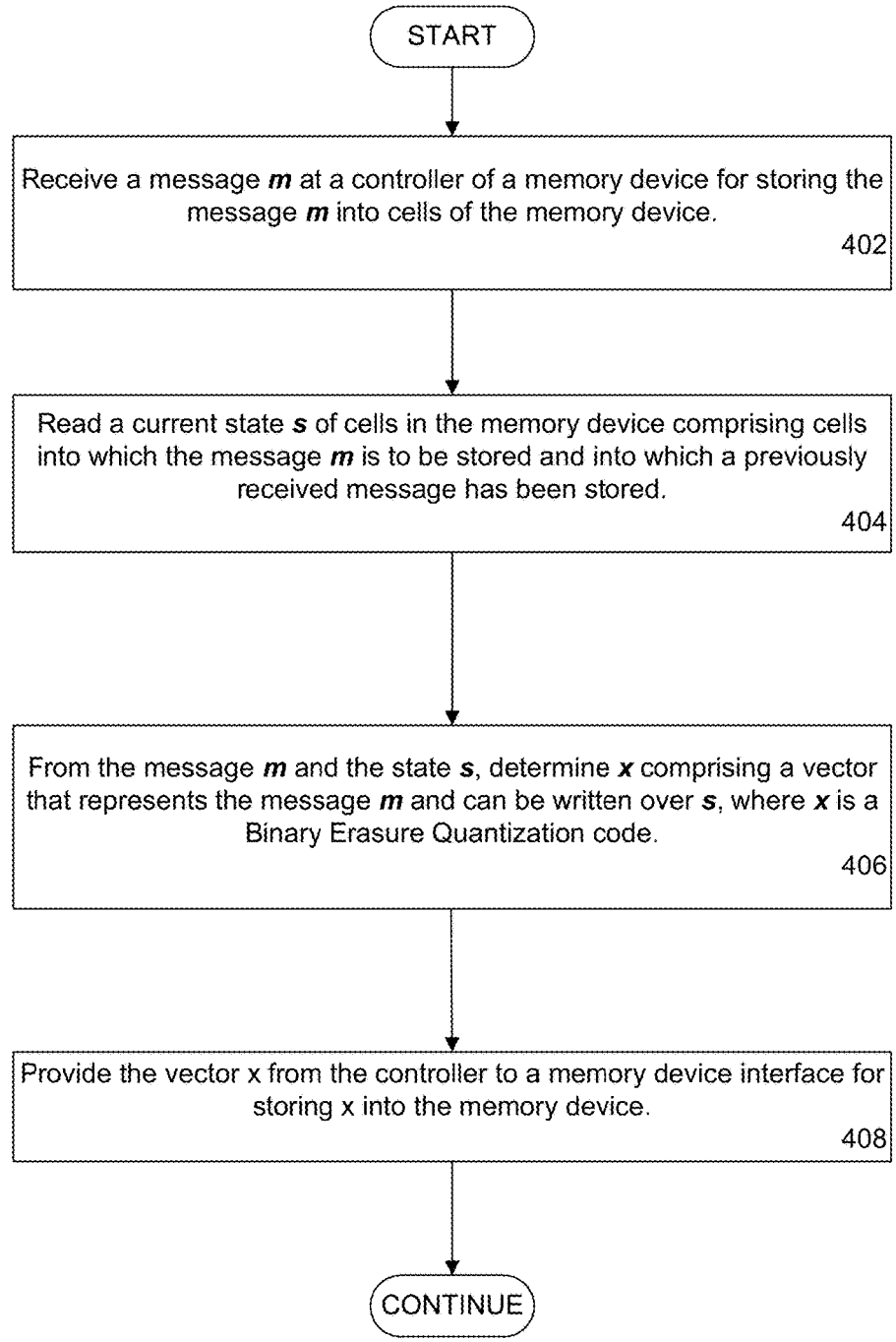
FIG. 4 is a flow diagram that shows reading operations of a data storage device constructed in accordance with the description herein.

FIG. 4 is a flow diagram that shows the operations of a data storage device using the rewriting scheme as described herein. The data storage device may comprise a variety of systems and components, whether as a device external to computing devices for data storage, or integrated with other components of a system for data storage. The data storage device may be implemented, for example, as a Flash memory external device, such as a USB-compatible "thumb drive" or the like, or the storage device may be implemented as an internal component such as a "solid state drive" (SSD) for use in place of a hard disk drive in desktop and laptop computers. The data storage device receives message comprising data for programming (storage) from a host device, and provides data read from the data storage to a host device. Data passes to and from the data storage device over a data channel. For example, in the case of a thumb drive, the host device may comprise the computing device with which the thumb drive communicates via the USB data channel, and in the case of the SSD, the host device may comprise the SSD controller that manages the data interface to an associated system bus of a computer in which the SSD is installed. In FIG. 4, the "Start" box represents the point at which the illustrated operations begin, and the "Continue" box represents the point at which the illustrated operations are completed and operation of the device continues under normal conditions.

FIG. 4 shows, at the first box 402, that a data storage memory device that operates in accordance with the rewriting scheme first receives a message m at a controller of the data storage memory device for storing the message m into cells of the data storage memory device. At the next operation, box 404, the controller reads a current state s of cells in the memory device comprising cells into which the message m is to be stored and into which a previously received message has been stored.

At the box 406, from the data of the message m and the state s, the controller determines a vector x comprising a vector that represents the message m and can be written over s, where x is a Binary Erasure Quantization code. The vector x may optionally comprise a code with error correction capability based on WOM codes, such as low-density-parity-check (LDPC) codes or low-density-generator-matrix (LDGM) codes.

At the box 408, the vector x is provided from the controller to a memory device interface for storing x into the memory device. As noted further below, a failure to determine a suitable value for x may be handled in a variety of ways.

Figure 5:
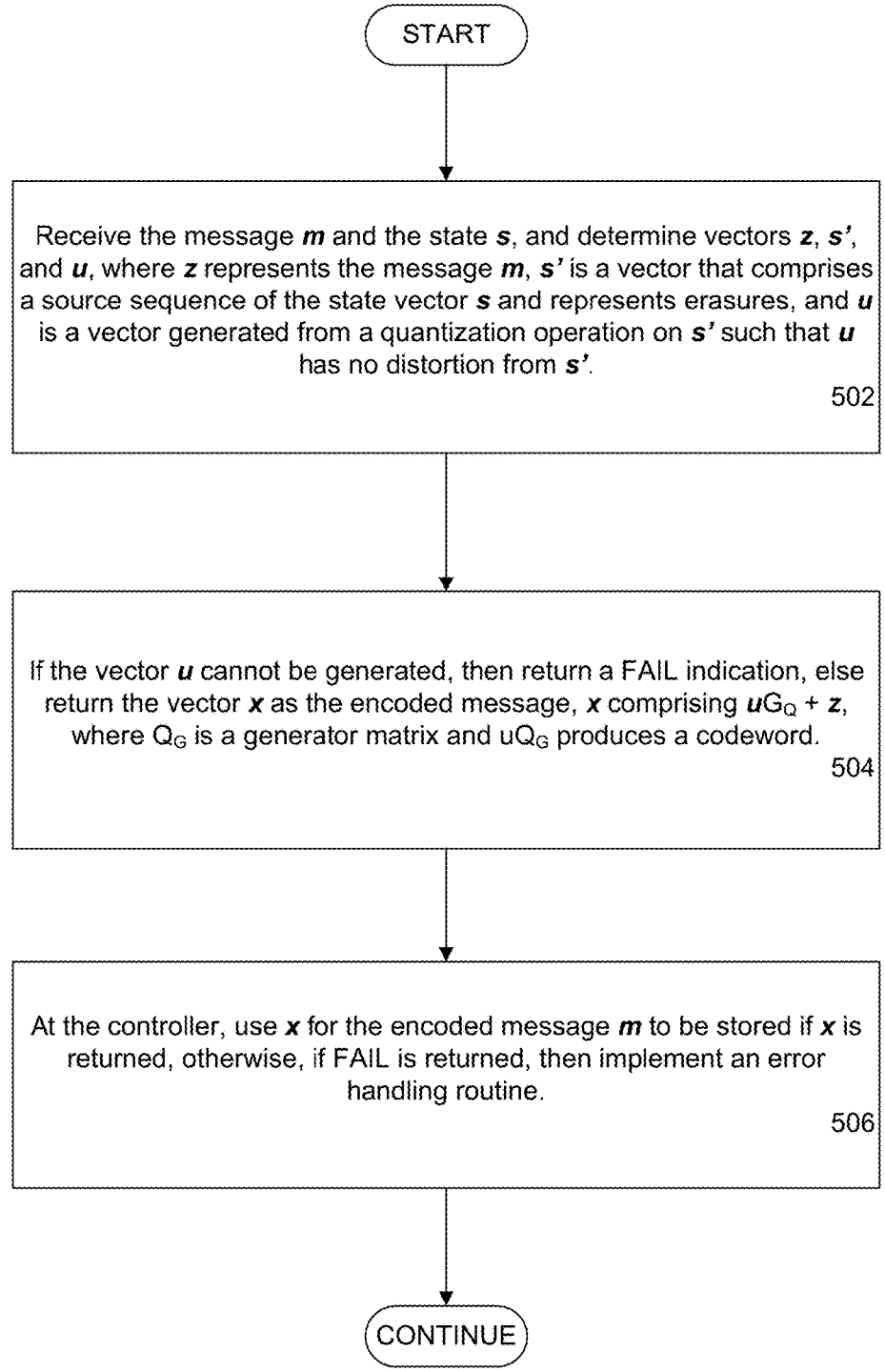
FIG. 5 is a flow diagram that shows programming operations of a data storage device constructed in accordance with the description herein.

FIG. 5 is a flow diagram that shows the operations of a data storage device using the rewriting scheme as described herein. More particularly, FIG. 5 shows operations that may comprise processing of the FIG. 4 box 409, which relates to the code generation. In FIG. 5, the "Start" box represents the point at which the illustrated operations begin, and the "Continue" box represents the point at which the illustrated operations are completed and operation of the device continues under normal conditions.

In the first FIG. 5 operation, at box 502, the controller receives the message m and the state s, and determines vectors $z$, s', and u, where $z$ represents the message m, s' is a vector that comprises a source sequence of the state vector s and represents erasures, and u is a vector generated from a quantization operation on s' such that u has no distortion from s'.

Next, at the box 504, if the vector u cannot be generated, then the controller returns a FAIL indication. Otherwise, the controller returns the vector x as the encoded message, where x comprises $uG_Q + z$, where $Q_G$ is a generator matrix and $uQ_G$ produces a codeword.

Lastly, at the box 506, the controller uses x for the encoded message m to be stored, that is, x corresponds to the encoded m, if x is returned at box 504. If x is not returned at box 504, such as if FAIL is returned, then the device implements an error handling routine. Examples of error handling routines may include attempting to store the message m elsewhere, such as at a memory device block that does not include stored data at the time the message m is received. Such a scheme effectively treats the incoming message m as the first message, rather than a subsequent message that is to be stored without a block erasure operation. An alternative error handling routine may comprise performing a block erasure routine to store the message m. The block erasure in this instance does not present an onerous memory device operation, because as noted above in the discussion of rewrite failure rates, for typical memory device configurations, an error rate of only 0.0001 may be expected, which is roughly one error (failure to find x) per 10,000 writes.

It should be noted that the rewriting code may be implemented for an information channel comprising a transmitted signal, rather than comprising a data connection to memory cells. In that situation, the operations of FIG. 4 would be performed analogously. For example, the data read and store operations of box 402 and 408 would correspond to wirelessly receiving a signal and sending a signal, respectively, rather than reading memory cell charge levels and providing the encoded message x over a data bus or circuit trace. The signal features can comprise modulation of the signal frequency, magnitude, or duration over time.

Figure 6:
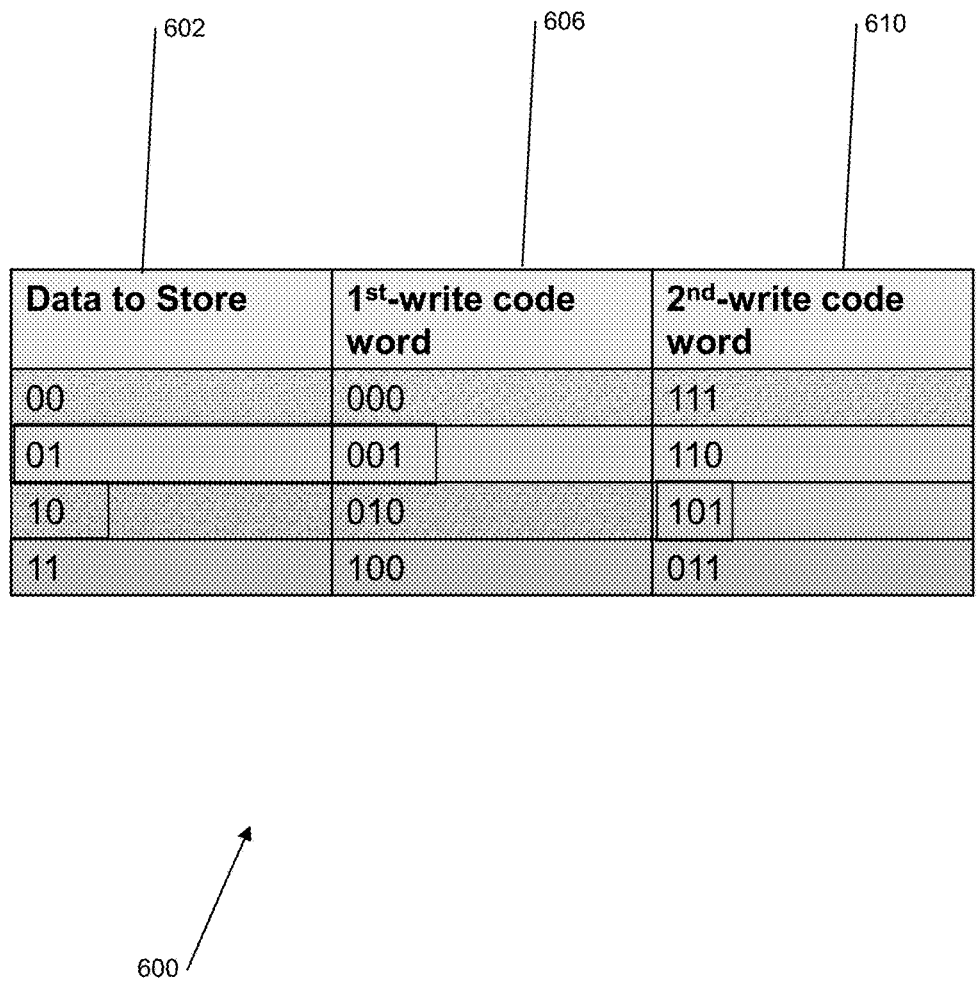
FIG. 6 is a table that shows data to store in a memory device, a current state of cells in the memory device, and a codeword to be stored in the memory device that represents the data to store.

FIG. 6 is a table 600 that shows data in three columns, to illustrate how the incoming message m may be encoded such that regardless of the current state s of a memory block (the first-write codeword), it is possible to generate a second-write codeword that may be stored to represent the message m such that the second-write codeword only involves only adding electrical charge to any cell of the current (first-write) state to obtain the second-write state.

For example, for a two-bit message m, FIG. 6 shows the first column 602 with all possible two-bit combinations as the data to store (m). Then, for a given first-write codeword in column 606, an encoded codeword may be generated. FIG. 6 shows a simple example of the encoding scheme, where the second-write codeword merely comprises the conjugation (complement) of the first codeword. Nevertheless, FIG. 6 shows processing related to the encoding operation, and illustrates that the encoded codewords will typically occupy more data bits than the original message m. To recover a message from its encoded representation, operations that correspond to inverse encoding operations may be used. Such data recovery operations may be obtained in view of the encoding operations described herein.

Figure 7:
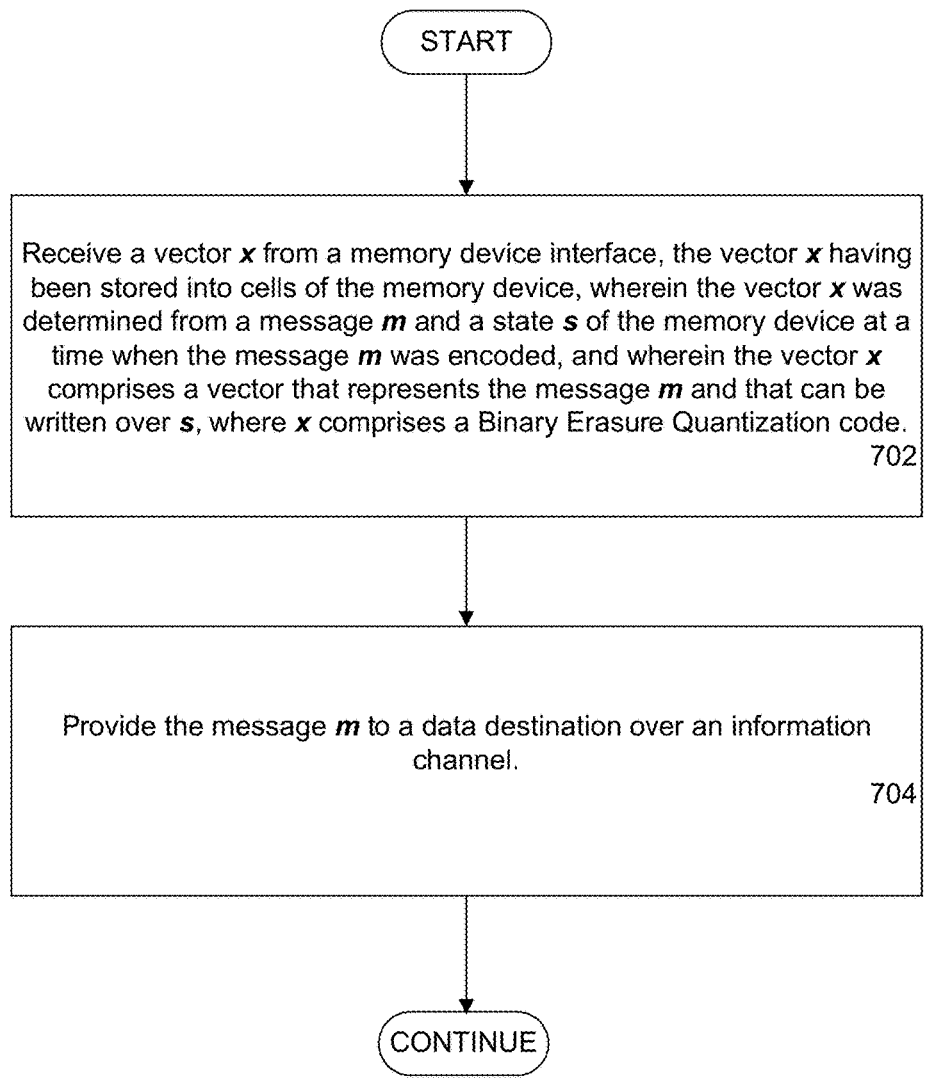
FIG. 7 is a flow diagram that shows operations for decoding a stored value from a data memory device.

FIG. 7 is a flow diagram that shows operations for decoding a stored value from a data memory device. In FIG. 7, the "Start" box represents the point at which the illustrated operations begin, and the "Continue" box represents the point at which the illustrated operations are completed and operation of the device continues under normal conditions.

In the first operation, at the box 702, the device controller receives a vector x from a memory device interface. The received vector x was stored into cells of the memory device, and the vector x was determined from a received data message m and a state s of the memory device at a time when the message m was encoded. In addition, the vector x comprises a vector that represents the message m and that can be written over s, where x comprises a Binary Erasure Quantization code.

In the second decoding operation, at 704, the device provides the message m to a data destination over an information channel.

It should be noted that the vector x stored into the memory device can be a vector generated using the encoding techniques described herein. For example, the vector x may be generated from vectors $\tilde{z}$, s', and u, where $\tilde{z}$ represents the message m, s' is a vector that comprises a source sequence of the state vector s and represents erasures, and u is a vector generated from a quantization operation on s' such that u has no distortion from s'. Moreover, the vector x may comprise a code with error correction capability, including BCH codes and codes that are low-density-parity-check (LDPC) codes. In addition, the Binary Erasure Quantization code may comprise a low-density-generator-matrix (LDGM) code.

Figure 8:
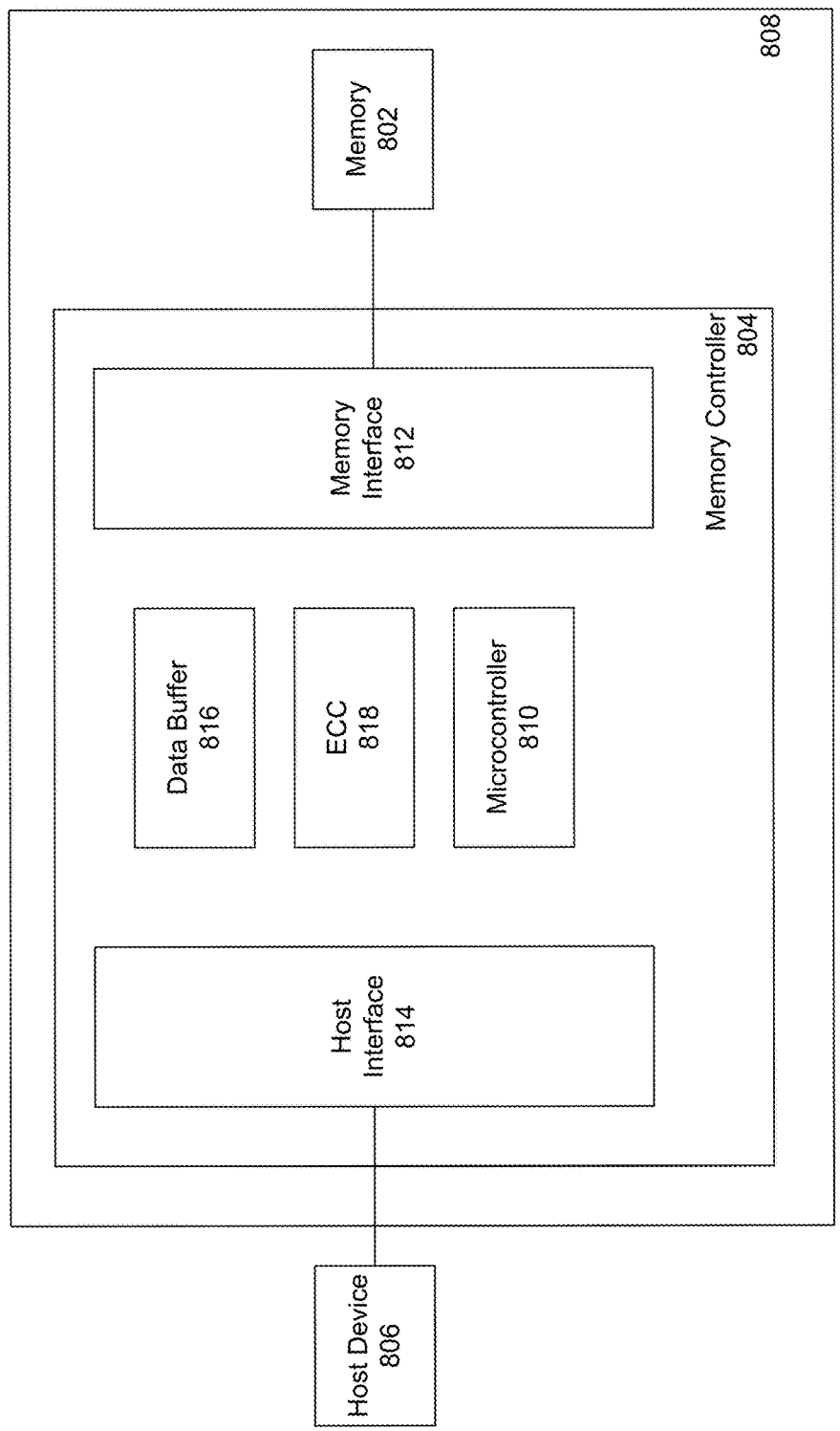
FIG. 8 is a block diagram of a memory device constructed in accordance with this disclosure.

FIG. 8 is an illustration of a data device constructed in accordance with the present invention. FIG. 8 shows a memory 802 that is accessed by a memory controller 804 that communicates with a host device 806. The memory 802 is used for storing data that is represented in accordance with a rewriting coding scheme. The memory may be implemented, for example, as a Flash memory having multilevel cells. The memory 802 and memory controller 804 together comprise a data storage memory device 808 that may be external to the host device or may be integrated with the host device into a single component or system. For example, the data storage device 808 may comprise a Flash memory device (often referred to as a "thumb drive") that communicates with a host computer 806 via a USB connection, or the data storage device may comprise a solid state drive (SSD) that stores data for a host computer system. Alternatively, the data storage device may be integrated with a suitable host device to comprise a single system or component with rewriting memory, such as a smart phone, network router, MP3 player, or the like.

The memory controller 804 operates under control of a microcontroller 810, which manages communications with the memory 802 via a memory interface 812 and manages communications with the host device via a host interface 814. Thus, the memory controller supervises data transfers from the host 806 to the memory 802 and from the memory 802 to the host 806. The memory controller 804 also includes a data buffer 816 in which data values may be temporarily stored for transmission over the data channel controller 816 between the memory device 802 and the host 806. The memory controller also includes an ECC block 818 in which data for the ECC is maintained. For example, the ECC block 818 may comprise data and program code to perform error correction operations for rewriting code. Such error correction operations may be operations as described, for example, in the U.S. Patent Application entitled "Error Correcting Codes for Rewriting" by Anxiao Jiang et al. filed Nov. 20, 2008. The ECC block 818 may contain parameters for the error correction code to be used for the memory 802, such as programmed operations for translating between received symbols and error-corrected symbols, or the ECC block may contain lookup tables for codewords or other data, or the like. The memory controller 804 performs the operations described above for decoding data and for encoding data. Alternatively, the ECC features may be integrated within the codewords, as described above. The blocks within the memory controller 808 are capable of communicating with each other, though they are illustrated without connecting lines for simplicity of illustration.

The operations described above for operating a data storage device, for reading data from a device, for programming a data storage device, and encoding and decoding, can be carried out by the operations depicted in FIGS. 4 and 5, which can be performed by the microcontroller 810 and associated components of the data storage device 808. For example, in an implementation of the rewriting coding scheme in a USB thumb drive, all the components of the data storage device 808 depicted in FIG. 8 are contained within the USB thumb drive.

The processing components such as the controller 804 and microcontroller 810 may be implemented in the form of control logic in software or hardware or a combination of both, and may comprise processors that execute software program instructions from program memory, or as firmware, or the like. The host device 806 may comprise a conventional computer apparatus. A conventional computer apparatus also may carry out the operations described herein and depicted in FIGS. 4 and 5. FIG. 8 is a block diagram of a computer apparatus 800 sufficient to perform as a host device and sufficient to perform the operations described herein and depicted in FIGS. 4 and 5.

Figure 9:
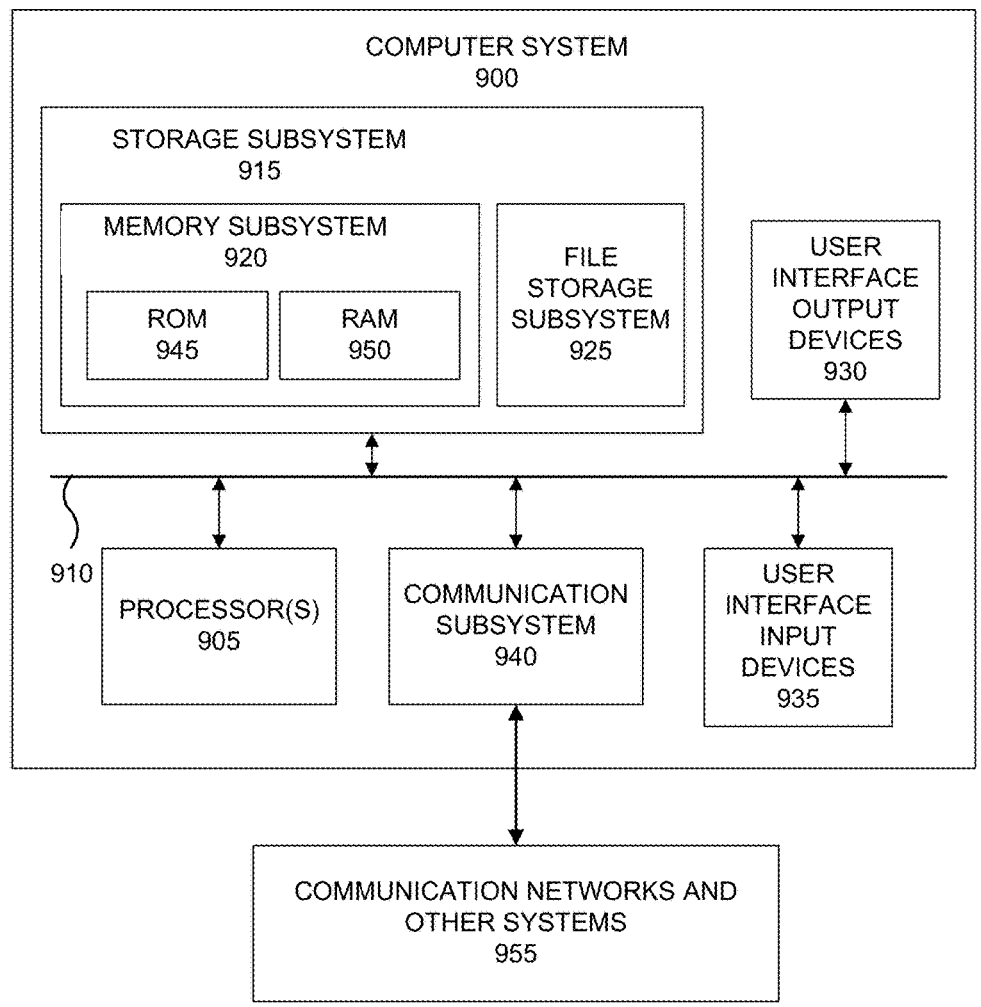
FIG. 9 is an illustration of a memory device constructed in accordance with the present invention.

FIG. 9 is a block diagram of a computer system 900 that may incorporate embodiments of the present invention and perform the operations described herein. The computer system 900 typically includes one or more processors 905, a system bus 910, storage subsystem 915 that includes a memory subsystem 920 and a file storage subsystem 925, user interface output devices 930, user interface input devices 935, a communications subsystem 940, and the like.

In various embodiments, the computer system 900 typically includes conventional computer components such as the one or more processors 905. The file storage subsystem 925 can include a variety of memory storage devices, such as a read only memory (ROM) 945 and random access memory (RAM) 950 in the memory subsystem 920, and direct access storage devices such as disk drives. As noted, the direct access storage device may comprise a rewriting data storage device that operates as described herein.

The user interface output devices 930 can comprise a variety of devices including flat panel displays, touchscreens, indicator lights, audio devices, force feedback devices, and the like. The user interface input devices 935 can comprise a variety of devices including a computer mouse, trackball, trackpad, joystick, wireless remote, drawing tablet, voice command system, eye tracking system, and the like. The user interface input devices 935 typically allow a user to select objects, icons, text and the like that appear on the user interface output devices 930 via a command such as a click of a button or the like.

Embodiments of the communication subsystem 940 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 940 may be coupled to communications networks and other external systems 955 (e.g., a network such as a LAN or the Internet), to a FireWire bus, or the like. In other embodiments, the communications subsystem 940 may be physically integrated on the motherboard of the computer system 900, may be a software program, such as soft DSL, or the like.

The RAM 950 and the file storage subsystem 925 are examples of tangible media configured to store data such as error correction code parameters, codewords, and program instructions to perform the operations described herein when executed by the one or more processors, including executable computer code, human readable code, or the like. Other types of tangible media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 925 includes reader subsystems that can transfer data from the program product media to the storage subsystem 915 for operation and execution by the processors 905.

The computer system 900 may also include software that enables communications over a network (e.g., the communications network 955) such as the DNS, TCP/IP, UDP/IP, and HTTP/HTTPS protocols, and the like. In alternative embodiments, other communications software and transfer protocols may also be used, for example IPX, or the like.

It will be readily apparent to one of ordinary skill in the art that many other hardware and software configurations are suitable for use with the present invention. For example, the computer system 900 may be a desktop, portable, rack-mounted, or tablet configuration. Additionally, the computer system 900 may be a series of networked computers. Further, a variety of microprocessors are contemplated and are suitable for the one or more processors 905, such as PENTIUM™ microprocessors from Intel Corporation of Santa Clara, Calif., USA; OPTERON™ or ATHLON XP™ microprocessors from Advanced Micro Devices, Inc. of Sunnyvale, Calif., USA; and the like. Further, a variety of operating systems are contemplated and are suitable, such as WINDOWS®, WINDOWS XP®, WINDOWS VISTA®, or the like from Microsoft Corporation of Redmond, Wash., USA, SOLARIS® from Sun Microsystems, Inc. of Santa Clara, Calif., USA, various Linux and UNIX distributions, and the like. In still other embodiments, the techniques described above may be implemented upon a chip or an auxiliary processing board (e.g., a programmable logic device or graphics processor unit).

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The schemes described herein can be implemented in a variety of systems for encoding and decoding data for transmission and storage. That is, a data message may be received at a memory device over an information channel and may be stored into cells of the memory device after encoding, using the techniques described herein. For decoding, an encoded data message may be received from cells of the memory device and may be decoded into their corresponding original message data values and provided to a destination, such as a memory or a processor, over an information channel.

Figure 10:
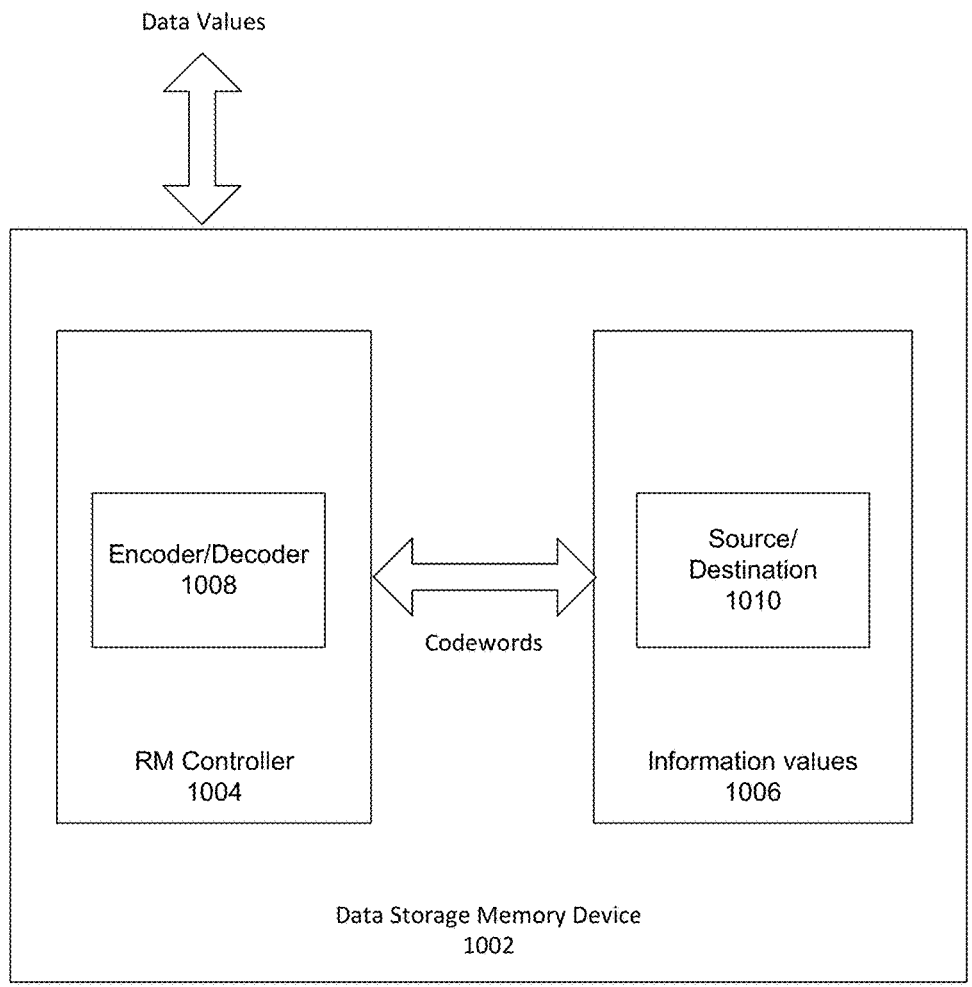
FIG. 10 is a block diagram of a computer apparatus for performing the programming and reading operations described herein and for communicating with a memory device such as depicted in FIG. 8 and FIG. 9.

The operations of encoding and decoding data can be depicted as in FIG. 10, which shows data flow in a data storage memory device 1002 that operates according to the coding schemes described herein. In FIG. 10, the device includes a device controller 1004 that stores and retrieves information values 1006. The device controller 1004 includes an encoder and decoder 10010 for encoding data values into codewords and decoding codewords into data values. The controller encodes data values and provides codewords to the source/destination block 1010, and decodes codewords from the source/destination and provides corresponding data values. The two-way nature of the data flow is indicated by the double-ended arrows labeled "data values" and "codewords". The controller includes interfaces through which the controller receives and provides the data values and the information values (codewords). The details of such interfaces will be known to those skilled in the art.

The information values 1006 comprise the means for physically representing data comprising the data values and codewords. For example, the information values 1006 may represent charge levels of memory cells, such that multiple cells are configured to operate as a virtual cell in which charge levels of the cells determine a permutation of the rank modulation code. Data values are received and encoded to permutations of a rank modulation code and charge levels of cells are adjusted accordingly, and rank modulation codewords are determined according to cell charge levels, from which a corresponding data value is determined. Alternatively, the information values 1006 may represent features of a transmitted signal, such as signal frequency, magnitude, or duration, such that the cells or bins are defined by the signal features and determine a permutation of the rewriting code.

For information values 1006 in the case of cell charge levels, the source/destination 1010 comprises memory cells in which n memory cells provide n cell values whose charge levels may define a rank modulation permutation. For storing a codeword, the memory cells receive an encoded codeword, as described above. The memory cells comprise a destination. For reading a codeword, the memory cells provide a codeword for decoding and comprise a source. In the case of data transmission, the source/destination 1010 may comprise a transmitter/receiver that processes a signal with signal features such as frequency, magnitude, or duration that define cells or bins such that the signal features determine a permutation. That is, signal components may comprise signal frequency, magnitude, or duration that may be controlled and modulated by the transmitter such that a highest signal frequency component or greatest magnitude component or greatest time component corresponds to a highest cell level, followed by signal component values that correspond to other cell values and thereby define a permutation of the rank modulation code. When the source/destination 1010 receives a codeword from the controller 1004, the source/destination comprises a transmitter of the device 1002 for sending an encoded signal. When the source/destination provides a codeword to the controller 1004 from a received signal, the source/destination comprises a receiver of the device for receiving an encoded signal.

What is claimed is:

1. A data storage device comprising:
a host interface configured to receive a binary representation of a message m;
a non-volatile memory device;
a memory device interface coupled to the non-volatile memory device; and
a controller configured to:
receive the message m for storing the message m into n cells of the non-volatile memory device;
read a current state s of the n cells of the non-volatile memory device in which a previously received message has been stored;
determine a vector x based on the message m and the current state s of the n cells, wherein the vector x represents the message m and can be written into the n cells over the current state s of the n cells without erasing the n cells; and
if the vector x cannot be determined,
provide a FAIL indication; and
implement an error handling routine;
otherwise,
provide the vector x to the memory device interface for storing the vector x into the n cells of the non-volatile memory device without erasing the n cells.

2. The data storage device as in claim 1, wherein determining the vector x comprises:
determining vectors $z$, s', and u, wherein the vector $z$ represents the message m, the vector s' comprises a source sequence of the current state s and represents erasures, and the vector u is generated from a quantization operation on the vector s' such that the vector u has no distortion from the vector s'; and
if the vector u cannot be generated,
providing the FAIL indication;
otherwise,
generating the vector x that comprises $uG_Q + z$, wherein $G_Q$ is a generator matrix and $uG_Q$ produces a codeword.

3. The data storage device as in claim 1, wherein the error handling routine comprises attempting to store the message m at a memory device block that does not include stored data at a time when the message m is received.

4. The data storage device as in claim 1, wherein the error handling routine comprises:
performing a block erasure routine to create a memory device block that does not include stored data; and
causing the message m to be stored in the memory device block.

5. The data storage device as in claim 1, wherein the vector x comprises a code with error correction capability, the code including a BCH code or a low-density-parity-check (LDPC) code.

6. The data storage device as in claim 1, wherein the vector x comprises a Binary Erasure Quantization code.

7. The data storage device as in claim 6, wherein the Binary Erasure Quantization code comprises a low-density-generator-matrix (LDGM) code.

8. The data storage device as in claim 1, wherein the non-volatile memory device comprises a Flash memory.

9. A computer-implemented method of operating a non-volatile memory device, the computer-implemented method comprising:
receiving a message m for storing into n cells of the non-volatile memory device;
reading a current state s of the n cells in the non-volatile memory device in which a previously received message has been stored;
determining a vector x based on the message m and the current state s of the-n cells, wherein the vector x represents the message m and can be written into the n cells over the current state s of the n cells without erasing the n cells; and
if the vector x cannot be determined,
providing a FAIL indication; and
implementing an error handling routine,
otherwise,
providing the vector x to a memory device interface for storing the vector x into the n cells of the non-volatile memory device without erasing the n cells.

10. The computer-implemented method as in claim 9, wherein determining vector x comprises:
determining vectors $z$, s', and u, wherein the vector z represents the message m, the vector s' comprises a source sequence of the current state s and represents erasures, and the vector u is generated from a quantization operation on the vector s' such that the vector u has no distortion from the vector s'; and
if the vector u cannot be generated,
providing the FAIL indication,
otherwise,
generating the vector x that comprises $uG_Q + z$, wherein $G_Q$ is a generator matrix and $uG_Q$ produces a codeword.

11. The computer-implemented method as in claim 9, wherein the error handling routine comprises attempting to store the message m at a memory device block that does not include stored data at a time when the message m is received.

12. The computer-implemented method as in claim 9, wherein the error handling routine comprises:
performing a block erasure routine to create a memory device block that does not include stored data; and
causing the message m to be stored in the memory device block.

13. The computer-implemented method as in claim 9, wherein the vector x comprises a code with error correction capability, the code including a BCH code or a low-density-parity-check (LDPC) code.

14. The computer-implemented method as in claim 9, wherein the vector x comprises a Binary Erasure Quantization code.

15. The computer-implemented method as in claim 14, wherein the Binary Erasure Quantization code comprises a low-density-generator-matrix (LDGM) code.

16. The computer-implemented method of claim 9, further comprising:
receiving the vector x from the non-volatile memory device via the memory device interface;
decoding the message m using $x H^T$, wherein H is a parity check matrix; and
providing the message m to a data destination over an information channel.

17. The computer-implemented method as in claim 16, wherein the vector x is generated from vectors $z$, s', and u, wherein the vector $z$ represents the message m, the vector s' comprises a source sequence of the state s and represents erasures, and the vector u is generated from a quantization operation on the vector s' such that the vector u has no distortion from the vector s'.

18. The computer-implemented method as in claim 16, wherein the vector x comprises a code with error correction capability, the code including a BCH code or a low-density-parity-check (LDPC) code.

19. The computer-implemented method as in claim 16, wherein the vector x comprises a Binary Erasure Quantization code.

20. The computer-implemented method as in claim 19, wherein the Binary Erasure Quantization code comprises a low-density-generator-matrix (LDGM) code.

* * * * *